(12) United States Patent
Thomas et al.

(10) Patent No.: US 7,006,010 B2
(45) Date of Patent: Feb. 28, 2006

(54) CLAMP ASSEMBLIES AND METHODS

(75) Inventors: Kirk S. Thomas, 1013 Glenwood Way, Escondido, CA (US) 92026; Don M. Westergren, La Mesa, CA (US)

(73) Assignee: Kirk S. Thomas, Escondidio, CA (US)

( * ) Notice: Subject to any disclaimer, the term of this patent is extended or adjusted under 35 U.S.C. 154(b) by 415 days.

(21) Appl. No.: 10/281,269

(22) Filed: Oct. 28, 2002

(65) Prior Publication Data

US 2003/0128133 A1 Jul. 10, 2003

Related U.S. Application Data

(60) Provisional application No. 60/345,652, filed on Jan. 8, 2002.

(51) Int. Cl.
*H04Q 9/00* (2006.01)

(52) U.S. Cl. .................. 340/870.07; 324/126; 324/127; 340/310.01; 700/292; 700/293

(58) Field of Classification Search ............ 340/870.07, 340/870.276, 601, 310.01, 870.17; 324/241, 324/126, 127; 700/292, 293
See application file for complete search history.

(56) References Cited

U.S. PATENT DOCUMENTS

| | | | | |
|---|---|---|---|---|
| 4,384,289 A | * | 5/1983 | Stillwell et al. | 340/870.17 |
| 4,689,752 A | * | 8/1987 | Fernandes et al. | 700/292 |
| 4,709,339 A | * | 11/1987 | Fernandes | 700/293 |
| 4,724,381 A | * | 2/1988 | Crimmins | 324/127 |
| 4,794,327 A | * | 12/1988 | Fernandes | 324/126 |
| 4,799,005 A | * | 1/1989 | Fernandes | 324/127 |
| 4,801,937 A | * | 1/1989 | Fernandes | 340/870.16 |
| 4,818,990 A | * | 4/1989 | Fernandes | 340/870.07 |
| 4,829,298 A | * | 5/1989 | Fernandes | 340/870.27 |
| 4,904,996 A | * | 2/1990 | Fernandes | 340/870.07 |
| 4,914,996 A | * | 4/1990 | Lavorel | 83/151 |
| 6,650,113 B1 | * | 11/2003 | Sekiya | 324/258 |
| 6,873,152 B1 | * | 3/2005 | Kliman et al. | 324/241 |

\* cited by examiner

*Primary Examiner*—Albert K. Wong
(74) *Attorney, Agent, or Firm*—Jackson Patent Law Office

(57) ABSTRACT

Disclosed are systems and methods for indicating events at various locations in a power distribution system.

22 Claims, 15 Drawing Sheets

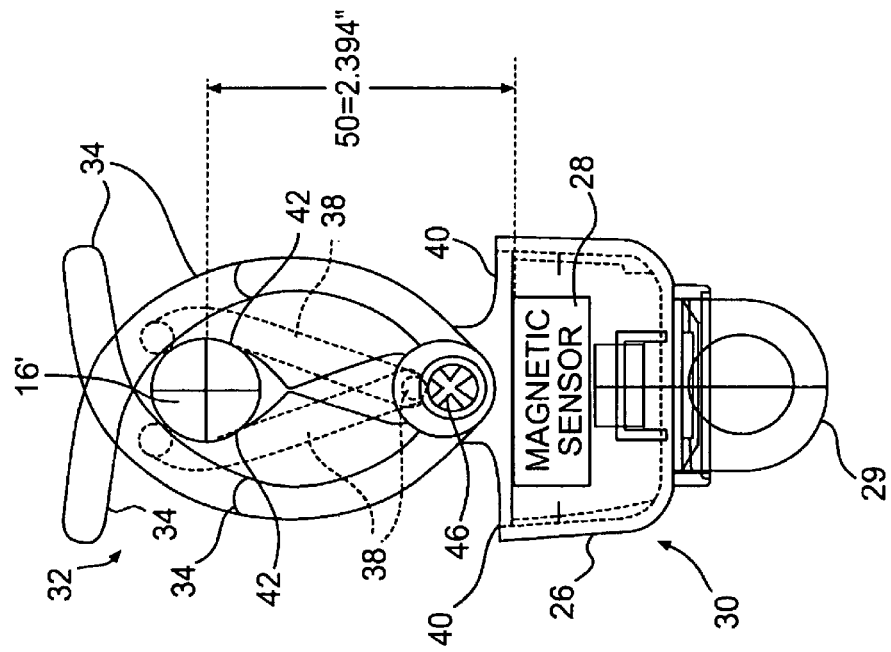
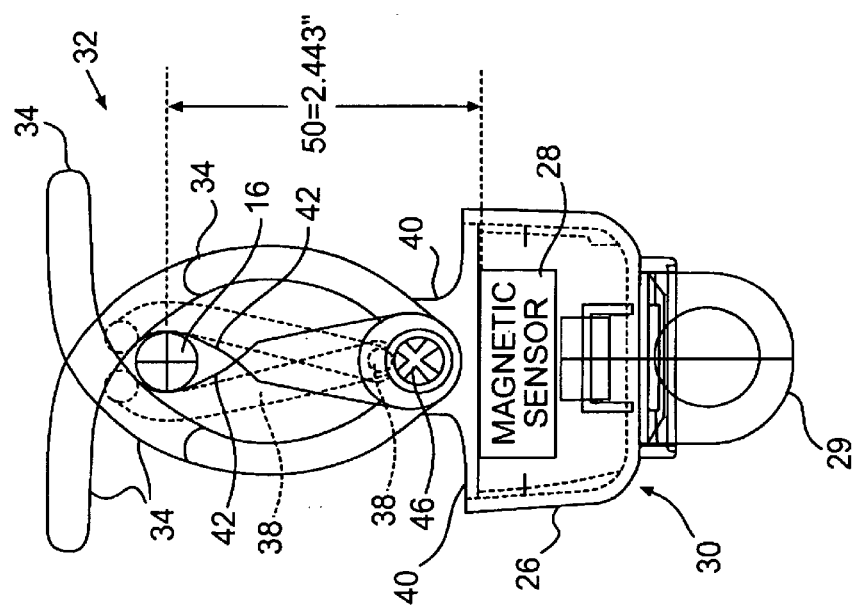
FIG. 12A
FIG. 12B

| CABLE DIA. | CENTER DISTANCE | VARIATION |
|---|---|---|
| 0.4 | 2.443 | 0.065 |
| 0.75 | 2.393 | 0.015 |
| 1.25 | 2.396 | 0.018 |
| 1.75 | 2.378 | 0 |
| 2.2 | 2.379 | 0.001 |
FIG. 13A
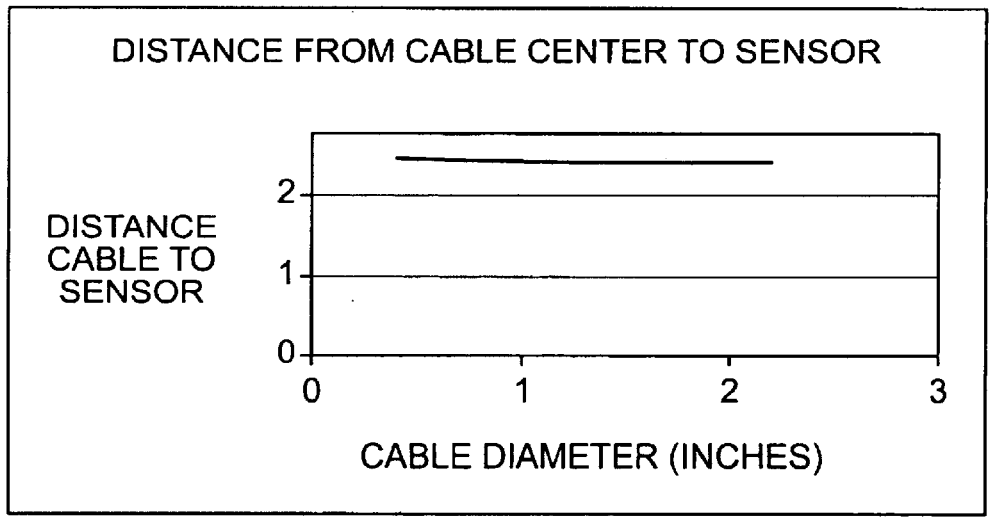
FIG. 13B
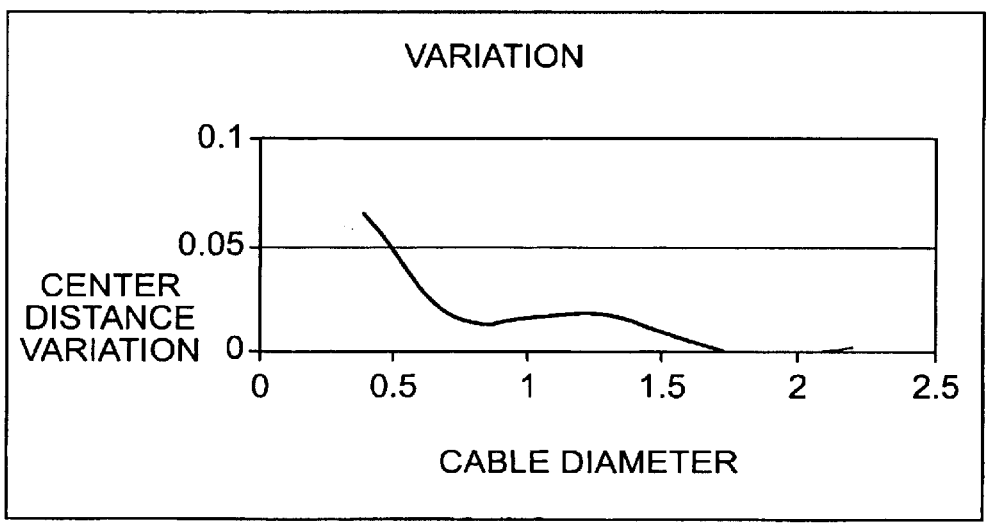
FIG. 13C

CLAMP ASSEMBLIES AND METHODS

This Application claims the benefit of application Ser. No. 60/345,652 of KIRK S. THOMAS and DON M. WETERGREN filed Jan. 8, 2002 for SYSTEMS AND METHODS FOR INDICATING EVENTS IN A POWER DISTRIBUTION SYSTEM, the contents of which are herein incorporated by reference.

BACKGROUND OF THE INVENTION

1. Field of the Invention

This invention relates generally to electrical power distribution systems and, more particularly, to systems and methods of detecting electrical conditions at various locations in a power distribution system.

2. Description of Related Art

Malfunctions in power distribution systems are often accompanied by transient current surges in certain locations of the system. To isolate and diagnose a malfunction, technicians may be dispatched to inspect various locations in the system. Because the current surges may be transient, however, these surges cannot be used as a diagnostic clue without equipment to record the occurrence of these surges.

Line mounted faulted circuit indicators may record surges. These indicators are typically mounted directly and permanently on an overhead conductor or an underground cable in a high voltage alternating current power distribution system. For accurate fault registration, the line outer diameter should be known prior to applying these devices, so that device parameters may be adjusted accordingly. For this reason, many line mounted faulted circuit indicators are misapplied and subsequently fail to operate properly.

SUMMARY OF THE INVENTION

It is an object of the present invention to address some of these problems of prior diagnostic tools and methods for a power distribution system.

To achieve this and other objects of the present invention, there is a method for a power distribution system including a generation station and a plurality of detection units, each including a flux detector. The method comprises the steps, performed for each control circuit, of applying the detection unit to a cable located away from the generation station, such that a distance of the flux detector from the cable is a decreasing function of the cable diameter; and detecting a current at a respective location in the power distribution system.

According to another aspect of the present invention, there is an apparatus for use with conductors of varying diameters. The apparatus comprises a holder for receiving a circuit at a fixed position relative to the holder; and a first member coupled to the holder; and a second member coupled to the holder, wherein the first and second members are shaped such that, when engaged with a first conductor having a first radius, the holder is separated from a center of the first conductor by a first distance, and when engaged with a second conductor having a radius larger than the first diameter the holder is separated from the center of the second conductor by a second distance, a difference between the first and second distances being less than a difference between the first and second radii.

According to yet another aspect of the present invention, there is a method for a system including a plurality of assembly, each assembly including a holder for receiving a circuit at a fixed position relative to the holder. The method comprises engaging, using a first assembly in the plurality of assemblies, a first conductor having a first radius, such that the holder is separated from a center of the first conductor by a first distance; engaging, using a second assembly in the plurality of assemblies, a second conductor having a radius larger than the first diameter, such that the holder is separated from the center of the second conductor by a second distance, a difference between the first and second distances being less than a difference between the first and second radii.

According to yet another aspect of the present invention, there is a mechanical configuration for a system including a plurality of assembies, each assembly including a holder for receiving a circuit at a fixed position relative to the holder. The configuration comprises means for engaging, using a first assembly in the plurality of assemblies, a first conductor having a first radius, such that the holder is separated from a center of the first conductor by a first distance; and means for engaging, using a second assembly in the plurality of assemblies, a second conductor having a radius larger than the first diameter, such that the holder is separated from the center of the second conductor by a second distance, a difference between the first and second distances being less than a difference between the first and second radii.

BRIEF DESCRIPTION OF THE DRAWINGS

FIGS. 12A, 12B, 12C, and 12D show the second preferred clamp mounted on lines of various diameter.

FIGS. 13A, 13B and 13C, depict variance in cable outer diameter and distance to center.

The accompanying drawings which are incorporated in and which constitute a part of this specification, illustrate embodiments of the invention and, together with the description, explain the principles of the invention, and additional advantages thereof. Throughout the drawings, corresponding parts are labeled with corresponding reference numbers.

DESCRIPTION OF THE PREFERRED EMBODIMENTS

First Preferred Embodiment

Figure 1:
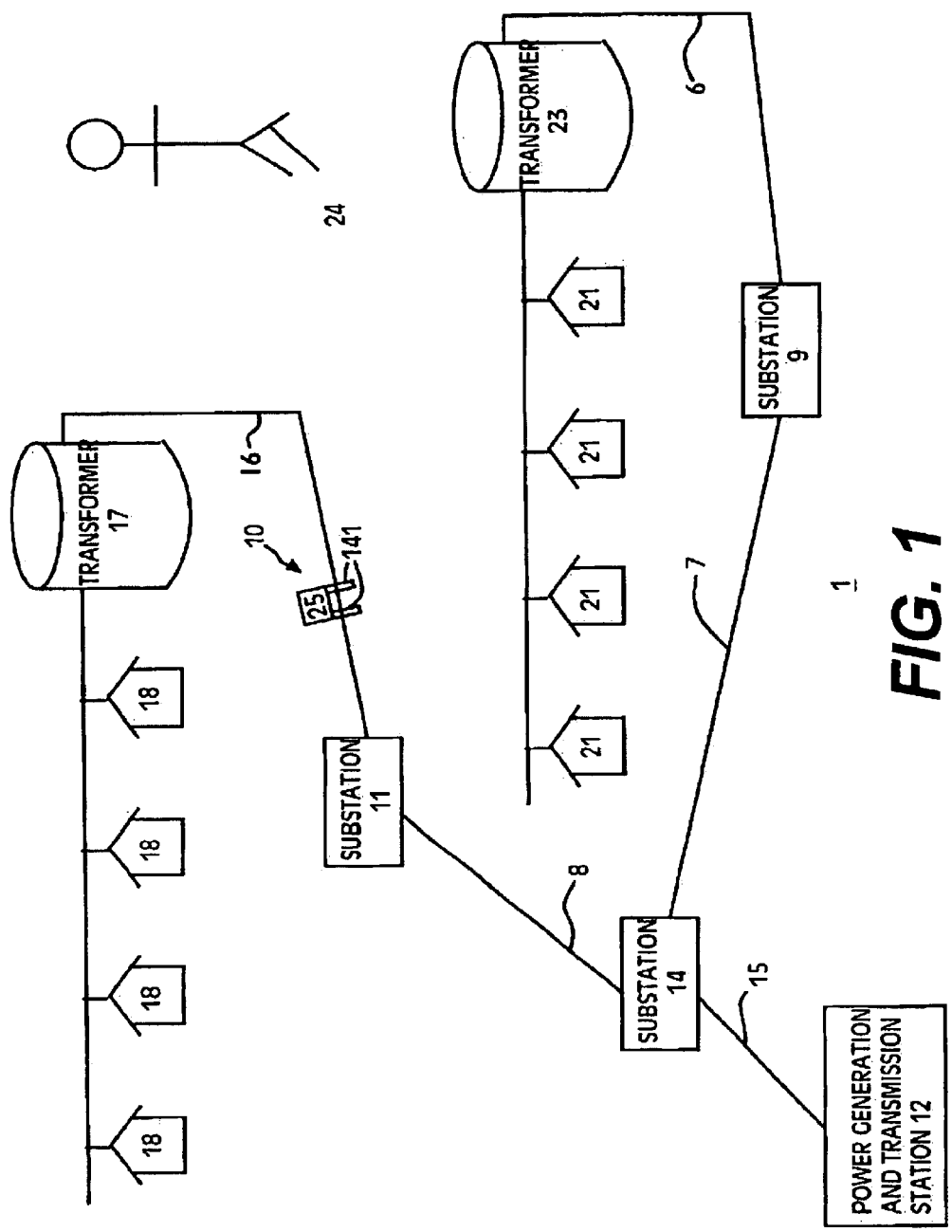
FIG. 1 is a diagram of a power distribution system employing a recording device in accordance with a preferred embodiment of the invention.

FIG. 1 shows the United States power distribution system 1 configured with electrical recordation device 10 in accordance with a preferred embodiments of the present invention. Power generation and transmission station 12 may be a hydroelectric power station, a fuel burning power station, or a wind power station, for example. Station 12 generates a high voltage power signal and transmits the signal over transmission lines 15, 8, and 7; and substations 14, 11, and 9. Substations 14, 11, and 9 act to step down the voltage generated by station 12. Substation 11 sends a power signal to transformer 17 via overhead cable 16. Transformer 17 steps down the voltage received on overhead cable 16 and transmits a 110 VAC power signal to homes 18.

Substation 9 sends a power signal to transformer 23 via cable 6. Transformer 23 steps down the voltage received on cable 6 and transmits a 110 VAC power signal to homes 21. In the event of a current surge in an adjacent conductor, such as cable 16 or cable 6, a recordation device 10 detects the surge and, in response to the detected surge, illuminates light 22 for a period of time, typically several hours. Thus, technician 24, who is inspecting various parts of distribution system 1, may observe the illumination of light 22 and be thus informed of the current surge that occurred on cable 16.

Clamp assembly 141 acts to mechanically couple device 10 to overhead cable 16.

Device 10 includes housing 25.

Figure 2A:
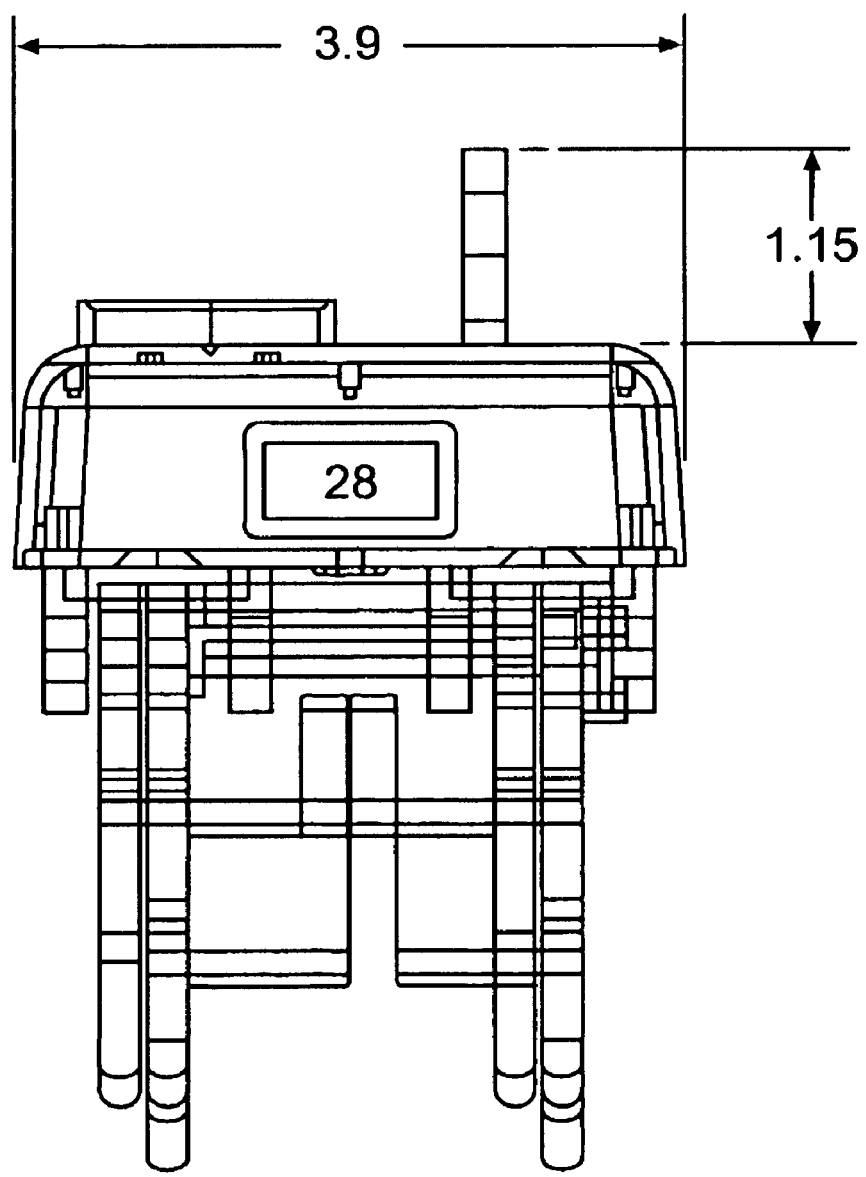
FIGS. 2A and 2B, are diagrams emphasizing a mechanical coupling assembly of the preferred recording device.
Figure 2B:
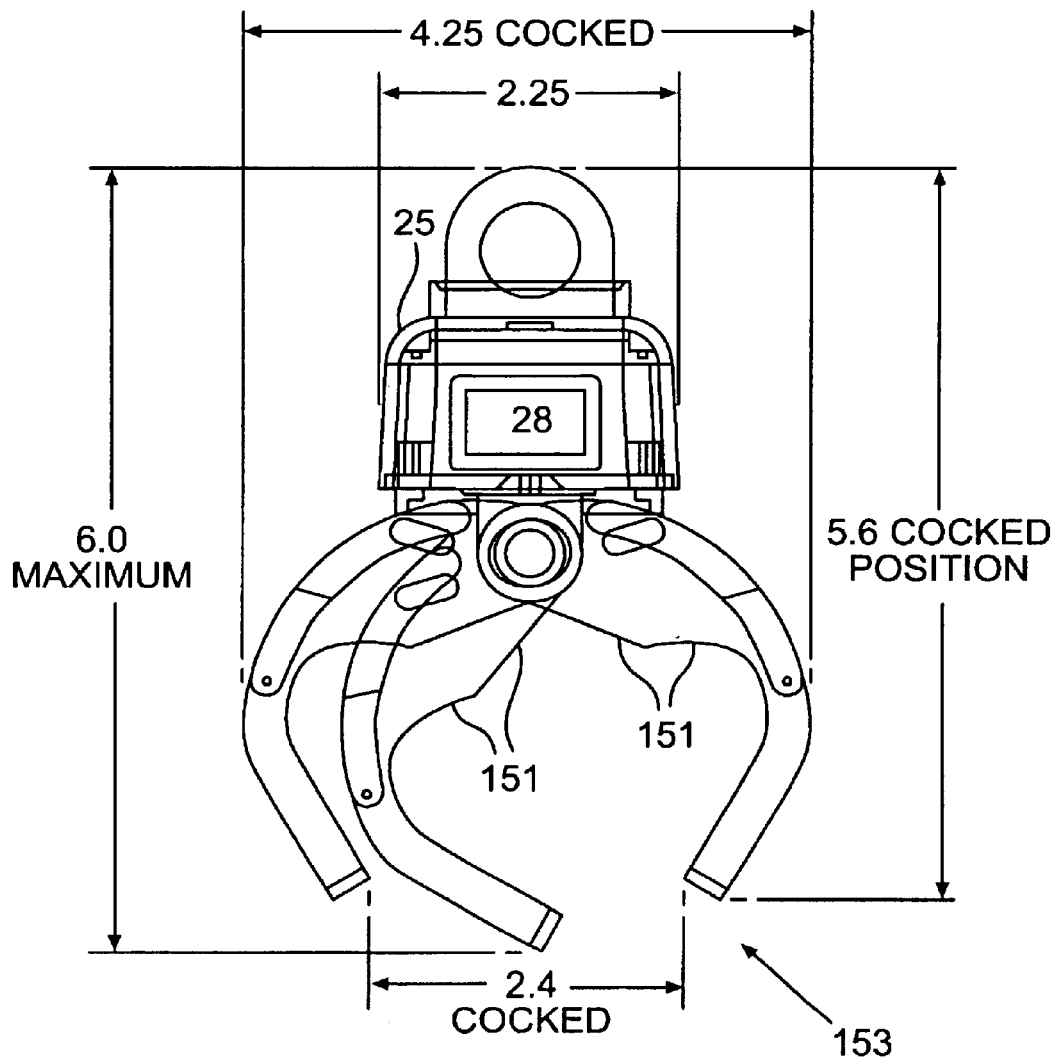

FIGS. 2A, 2B, and 2V emphasize clamp assembly 141 of device 10. Assembly 141 is a spring loaded, over center, toggle clamp with retainer pads to inhibit slippage. Contoured shape 151 of clamp jaw 153 maintains the center of cable 16 the same distance to an over current sensor located within the indicator body, even though the outer diameter of cable 16 may vary. More specifically, contoured shape 151 maintains reed switch 38 (FIG. 4) in circuitry 28 a constant distance from the center of cable 16, while the outer diameter of cable 16 may vary from 0.4 inches to 2.2 inches.

Thus, clamp assembly 141 helps to maintain a constant trip current calibration regardless of the outer diameter of cable 16.

Thus, clamp assembly 141 allows a single device to work at a constant calibrations setting over a range of cable diameters. Otherwise, the trip calibration level would increase as the cable increases, and decrease as the cable diameter decreases.

To hold jaws with both hands while spreading jaws 153 out and away from each other. With either or both index fingers, lift the trigger latch up into the cocked position. The clamp will become de-cocked when installed on applied cable. To manually de-cock the Acradle clamp@, hold clamp jaws firmly with both hands while pushing trigger latch down. Allow clamp jaws to collapse gently together. Injury may result by de-cocking clamp with fingers only.

Figure 3:
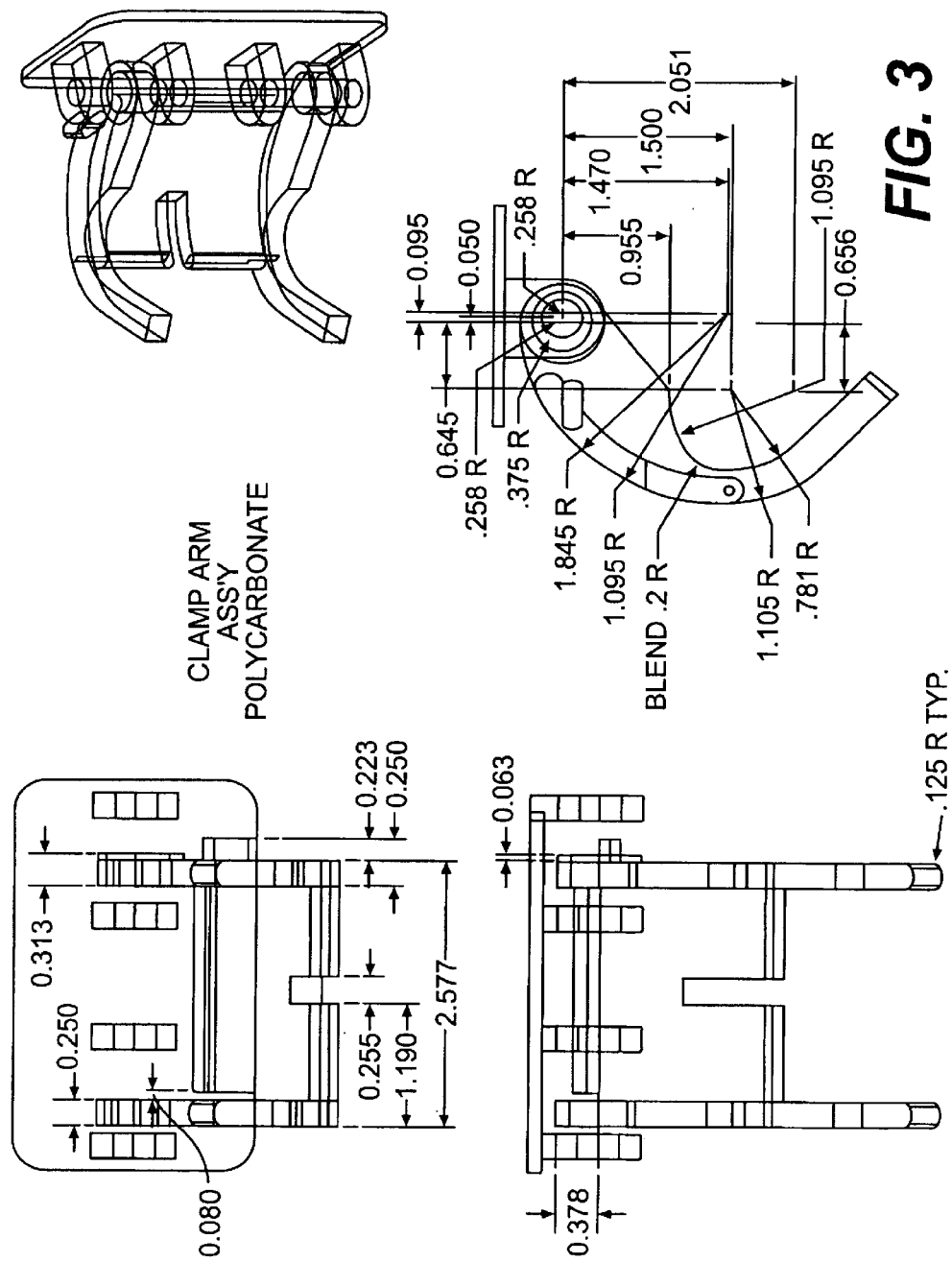
FIG. 3 is a diagram emphasizing an aspect of the coupling assembly.

FIG. 3 emphasis a part of clamp assembly 141 in more detail.

Figure 4:
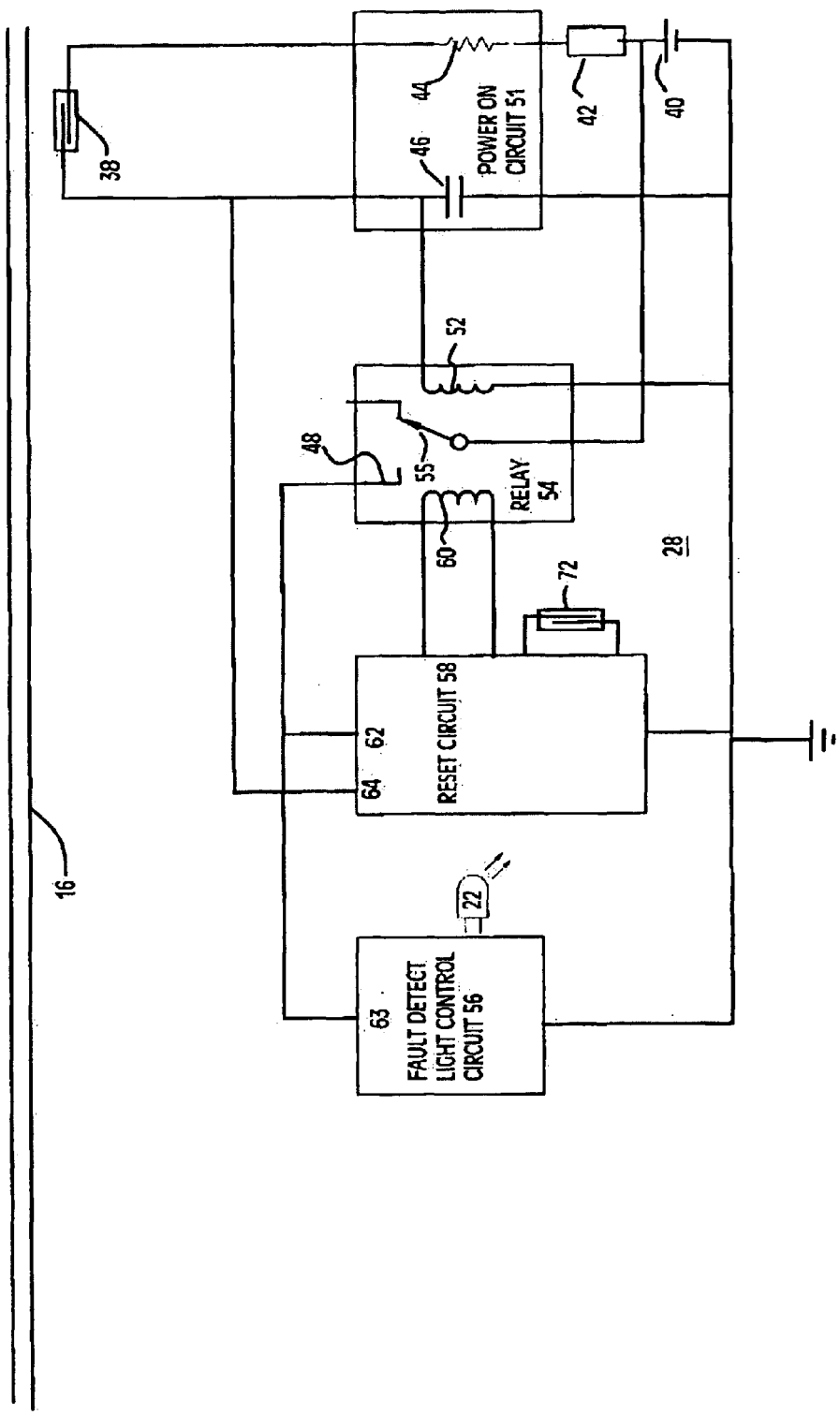
FIG. 4 is a diagram of a circuit in the housing of the recoding device.

FIG. 4 shows circuitry 28 in housing 25.

The operation of device 10 to detect and record a current surge will now be described.

On the occurrence of a current surge on cable 16, magnetic reads switch 38 effectively detects the excessive current in cable 16 and switch 38 thus closes for the duration of the surge. The duration of the surge is typically in a range 0.001 to 10 seconds.

This closure of switch 38 allows current flow from 3.6 volt lithium battery 40 through 10 ohm resistors 44 and set coil 52 of relay 54. In response to the current flow through set coil 52, relay armature 55 moves to touch contact 48, thereby supplying power from battery 40 to fault detect light control circuit 56 and reset circuit 58.

In response to receiving power on Vcc input 63, circuit 56 illuminates light emitting diode 22, allowing a technician to observe that an event occurred on cable 16.

After a period of time, reset circuit 58 energizes reset coil 60, causing armature 55 to break contact with contact 48, thereby removing the power supply by battery 40. Typically, reset circuit 58 will activate itself several hours after circuit 58 receives power on Vcc input 62. Thus, device 10 effectively records the presence of the current surge.

Discreet 3 $\mu f$ capacitor 46 is coupled to set coil 52 to enhance the sensitivity of circuit 28. Thus, detecting a current surge includes charging capacitor 46 and passing current from capacitor 46 to set coil 52. The value of capacitor 46 was chosen to minimize the duration of current surge, on cable 16, necessary to activate relay armature 55.

Thermal switch 42 will open if, for some reason, current has been flowing for too long a period. Thus, thermal switch 42 acts a safety precaution.

Figure 5:
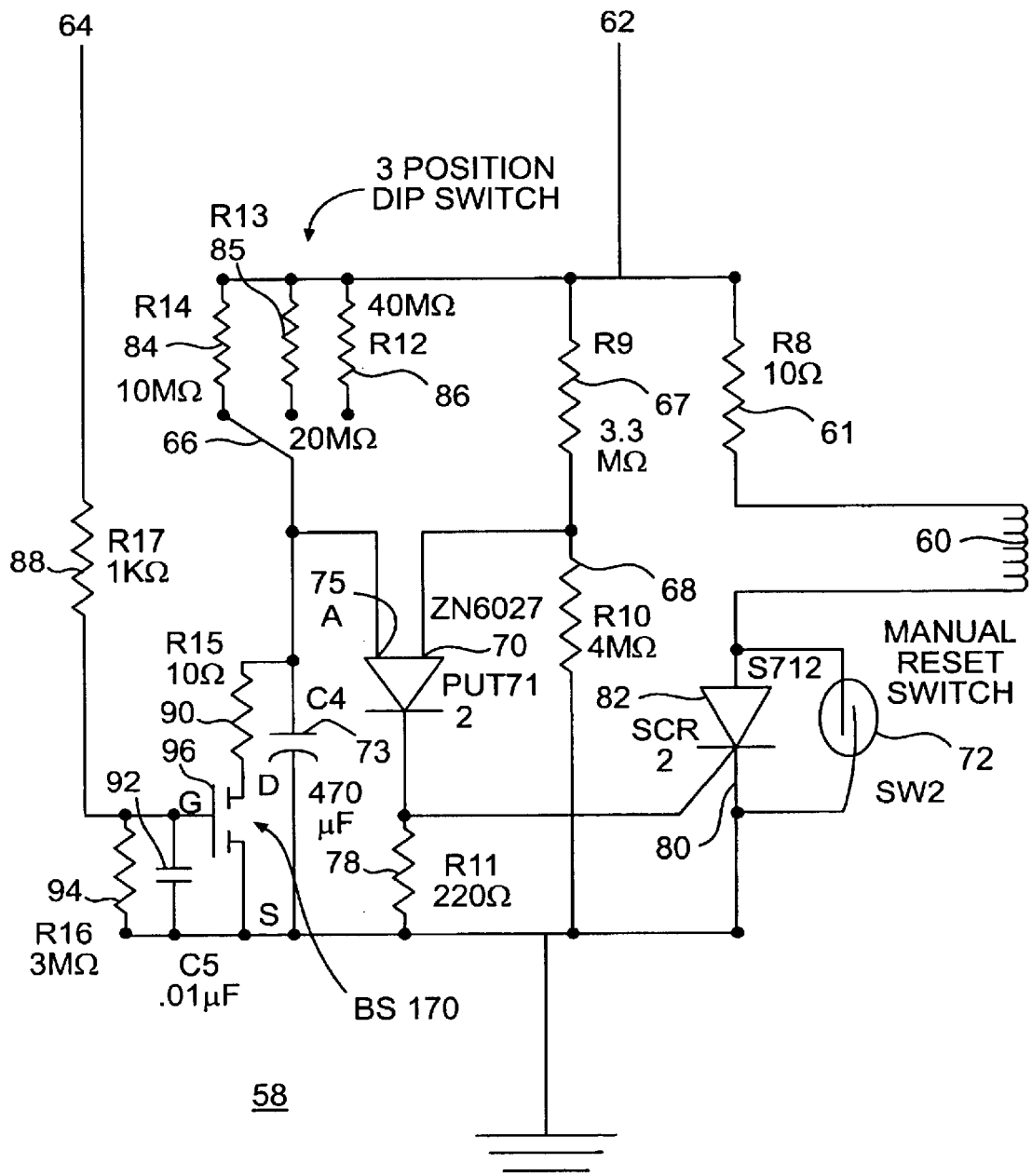
FIG. 5 is a diagram showing part of the circuit of FIG. 4 in more detail.

FIG. 5 shows reset circuit 58 in more detail. When circuit 58 receives power on power Vcc input 62, resistors 67 and 68 act as a voltage divider to supply a reference voltage to gate 70 of programmable unijunction transistor 71.

When circuit 58 receives power on Vcc input 62, the voltage on anode input 75 of transistor 71 rises, as capacitor 73 receives current via 3 position dip switch 66; and one of resistors 84, 85, 86. When the voltage on anode 75 reaches a certain value relative to the voltage on gate input 70, transistor 71 turns on, to supply a control signal to gate 80 of silicon control rectifier 82. Silicon control rectifier 82 thus turns on allowing current to flow through reset coil 60 of relay 54. Thus, reset circuit 58 acts to disconnects battery 40 from light control circuit 56, a period of time after a surge occurs on cable 16, thereby extinguishing light 22.

The display period for light 22 may be programmed by setting manual dip switch 66 to select one of the 3 resistors 84, 85, or 86 to vary the charging time for capacitor 73.

Thus, reed switch 38, relay 54, and capacitor 46 act to detect a current in an adjacent conduction path, such as cable 16. Circuit 56 activates light 22 in response to this detection. Circuit 58 acts to deactivate light 22 after a period of time, the period of time being a function of the position of manual switch 66.

To keep the display period for light 22 consistent, it may be desirable to discharge capacitor 73 between surges. More specifically, when reset circuit 58 activates to energize reset coil 60, residual voltage may remain on capacitor 73. If another surge occurs before capacitor 73 naturally discharges, the display period for light 22 will be shorter than normal. Thus, circuit 58 includes resistor 88, field effect transistor (FET) 96, capacitor 92, resistor 94, and resistor 90 for initializing circuit 58, by discharging capacitor 73. When reed switch 38 closes, switch 38 applies power from lithium battery 40 to initialization input 64, causing current to flow through resistor 88 to charge capacitor 92. FET 96 thus turns on, allowing capacitor 73 to discharge through resistor 90. Resistor 94 acts to discharge capacitor 92, and FET 96, therefore, is kept on for approximately 1 second.

Figure 6:
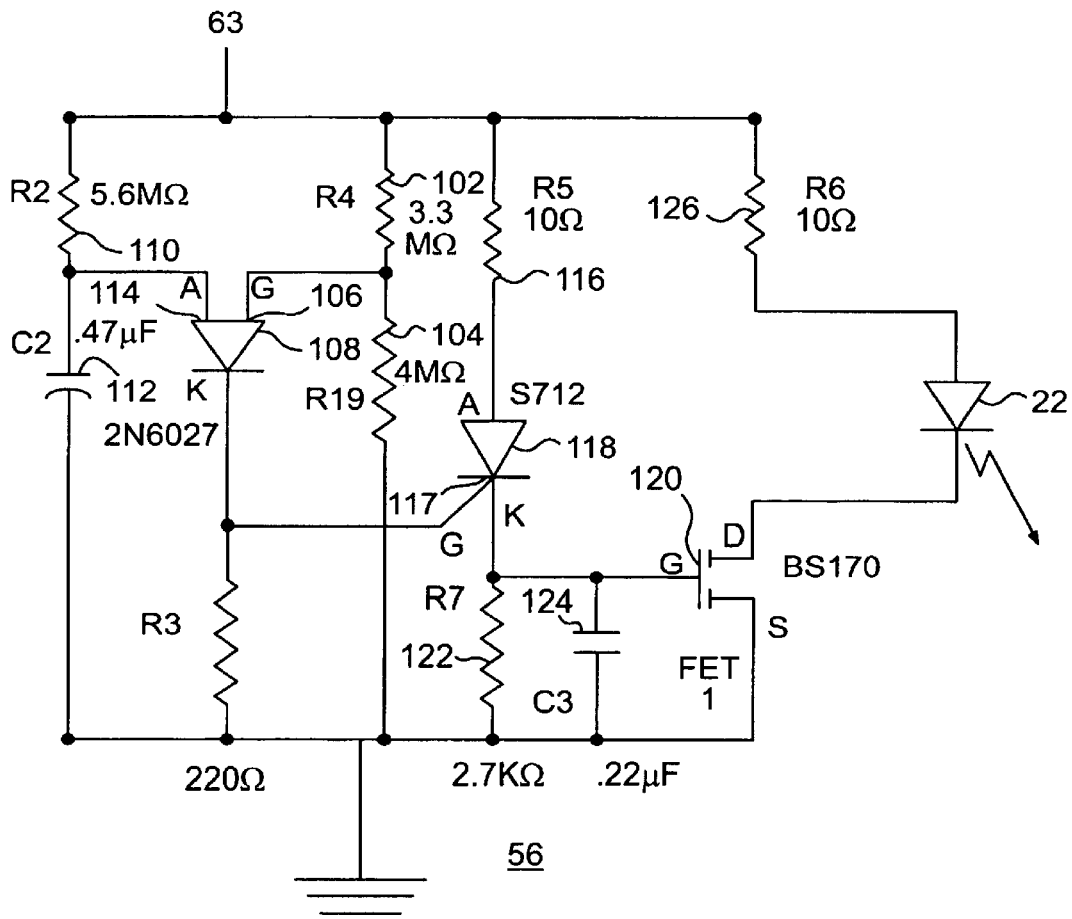
FIG. 6 is a diagram showing another part of the circuit of FIG. 4 in more detail.

FIG. 6 shows fault detect light control circuit 56 in more detail. A function of circuit 56 is to cause light 22 to flash periodically during the display period for light 22.

When circuit 56 receives power from Vcc input 63, resistors 102 and 104 act as a voltage divider to supply a reference voltage to gate 106 of programmable unijunction transistor 108.

When circuit 56 receives power on Vcc input 63, the voltage on anode input 114 of transistor 108 rises, as capacitor 112 receives current via resistor 110. When the voltage on anode 114 reaches a certain value relative to the voltage on gate input 106, transistor 108 turns on, to supply a control signal to gate 117 of silicon control rectifier 118. Silicon control rectifier 118 thus turns on allowing current to flow to capacitor 124.

Thus, capacitor 124 receives current via silicon controlled rectifier 118 and resistor 116 to charge up and apply a voltage to the gate of FET 120, to turn on FET 120, allowing current to flow through light 22, which is a light emitting diode (LED).

After capacitor 112 discharges, causing transistor 108 to turn off, and causing silicon control rectifier 118 to turn off, capacitor 124 discharges through resistor 122, causing FET 120 to turn off, ending the pulse of light from light 22.

In other words, gate 106 of transistor 108 may be considered a first control input and the anode 114 may be considered a second control input. Current through resistor 110 charges anode 114. Subsequently, when transistor 108 turns on, current from the cathode of transistor 108 charges gate 117 of rectifier 118. The current output of rectifier 118 charges the gate of FET 120, causing FET 108 to turn on, to illuminate LED 22. Circuit 56 repeats the proceeding acts a plurality of times for each display period.

In other words, input 62 is a first node for coupling to Vcc (a first reference voltage), and the source of transistor 96 is a second node for coupling to ground (a second reference voltage). Reed switch 38 generates a reed switch signal. Circuit 51 and relay 54 are responsive to the reed switch signal, and generate a power signal on contact 48. Circuit 56 generates a light control signal for LED 22, in response to the power signal.

Reset circuit 58 acts to block the power signal after a period of time. Dip switch 66 is coupled between an end of capacitor 73 and Vcc. FET 96 and is also a type of switch. FET 96 is coupled between the end of capacitor 73 and ground. FET 96 is responsive to the reed switch signal.

Referring again to FIGS. 4 and 5, reset circuit 58 may be manually activated by positioning a hand-held magnet in proximity switch 72. With reed switch 72 closed, silicon control rectifier 82 is shorted (bypassed), allowing current to flow through resistor 61, reset coil 60, and reed switch 72.

The orientation and position of reed switch 72 relative to cable 16 is such that the magnetic field generated by cable 16 will not close switch 72. Optimally, switch 72 is oriented parallel to the magnetic field from cable 16, as shown in FIG. 4. In FIG. 4, the magnetic field from cable 16 is parallel to a normal defined by the page.

Conversely, read switch 38 is oriented and located such that it will be closed by the magnetic field generated by cable 16. Optimally, switch 38 is oriented perpendicular to the magnetic field form cable 16.

It is presently preferred that relay 54 be an AZ847 Micro Miniature Polarized Relay, manufactured by American Zettler, Inc., 75 Columbia Aliso Viejo, Calif. 92656.

It is presently preferred that programmable unijunction transistors 70 and 118 be model 2N6027 manufactured by Motorola Corporation.

Device 10 may also be installed on underground cable. For underground installation, cable neutral wires should be routed such that ground return does not adversely affect accuracy.

In an alternate embodiment, device 10 includes a plate that capacitively couples to cable 16, allowing device 10 to detect the presence of voltage on cable 16 and display the results of such detection with an LED, as disclosed in U.S. application Ser. No. 09/709,575 of KIRK S. THOMAS filed Nov. 13, 2000 for SYSTEMS AND METHODS FOR INDICATING EVENTS IN A POWER DISTRIBUTION SYSTEM, the contents of which are herein incorporated by reference.

In another alternate embodiment, device 10 includes a plate to capacitively couple to cable 16 to detect the presence of voltage on cable 16, and includes circuitry to generate the diagnostic display depending on the detected voltage and the output of reed switch 38, as disclosed in U.S. application Ser. No. 60/336,723 of KIRK S. THOMAS filed Dec. 7, 2001 for SYSTEMS AND METHODS FOR INDICATING EVENTS IN A POWER DISTRIBUTION SYSTEM, the contents of which are herein incorporated by reference.

Second Preferred Embodiment

Figure 7:
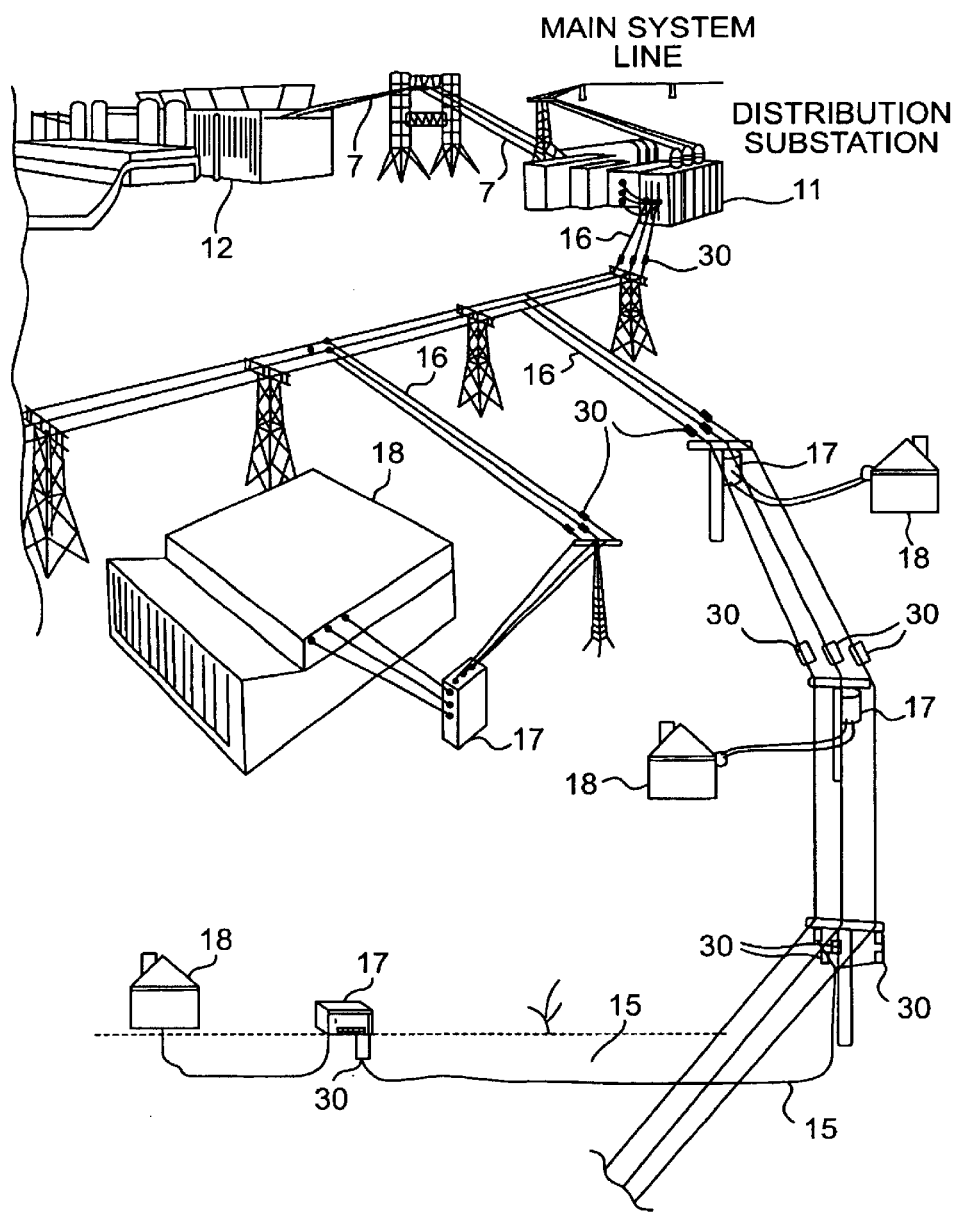
FIG. 7 is a diagram of a power distribution system employing faulted circuit indicator devices having a clamp in accordance with a second preferred embodiment of the invention.

FIG. 7 shows a power distribution system in the United States. System 1 is configured with electrical recording device 30 in accordance with a second preferred embodiment of the present invention. Power generation and transmission station 12 may be a hydroelectric power station, a fuel burning power station, or a wind power station, for example. Station 12 generates a high voltage power signal and transmits the signal over transmission lines 7; and distribution substation 11. Substations 11, act to step down the voltage generated by station 12, typically under 69,000 Volts. Substation 11 sends a power signal to transformers 17 via power lines 16. Transformers 17 steps down the voltage received on power lines 16 and transmits a power signal to utility customers 18.

Referring to FIGS. 8A, 8B, 9, and 10, recording device 30 is shown installed on power lines 16. Power line 16 is an electrical conductor, typically constructed of stranded or solid copper or aluminum materials. Line 16 is bare and exposed to the weather.

Figure 8A:
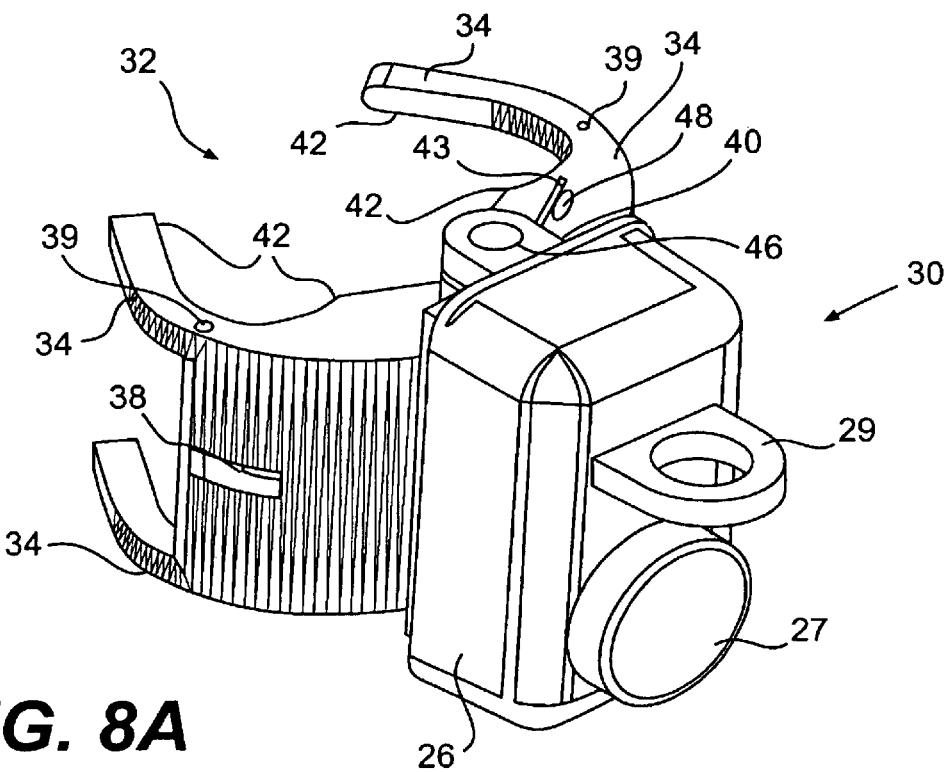
FIGS. 8A and 8B are perspective views of a faulted circuit indicator housing and a clamp constructed in accordance with the second preferred embodiment.
Figure 8B:
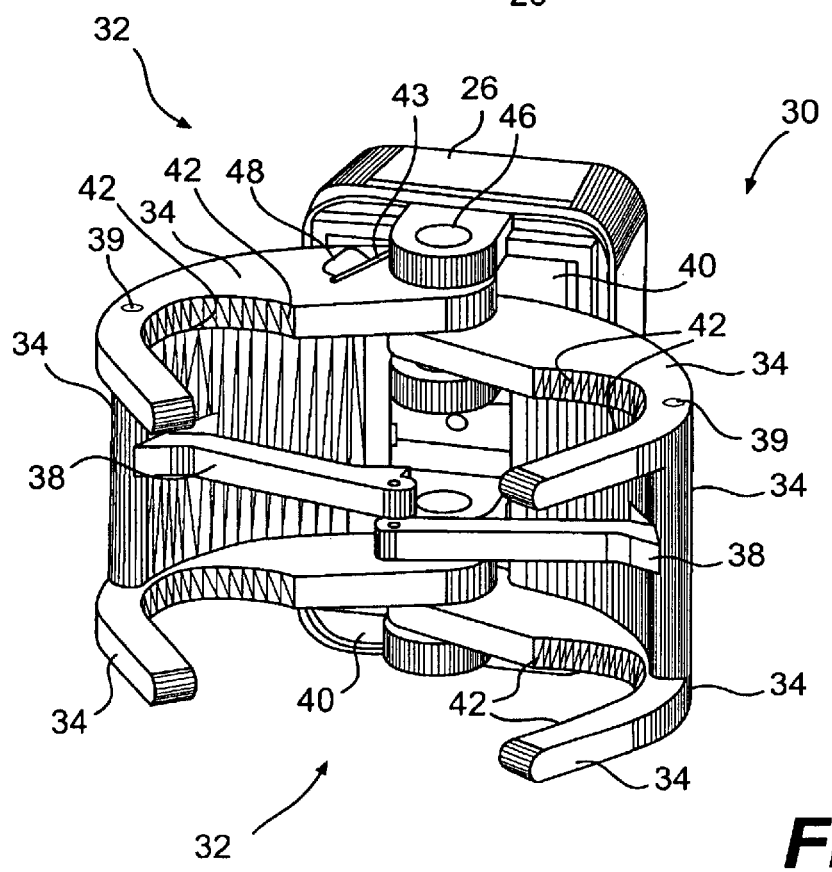
Figure 9:
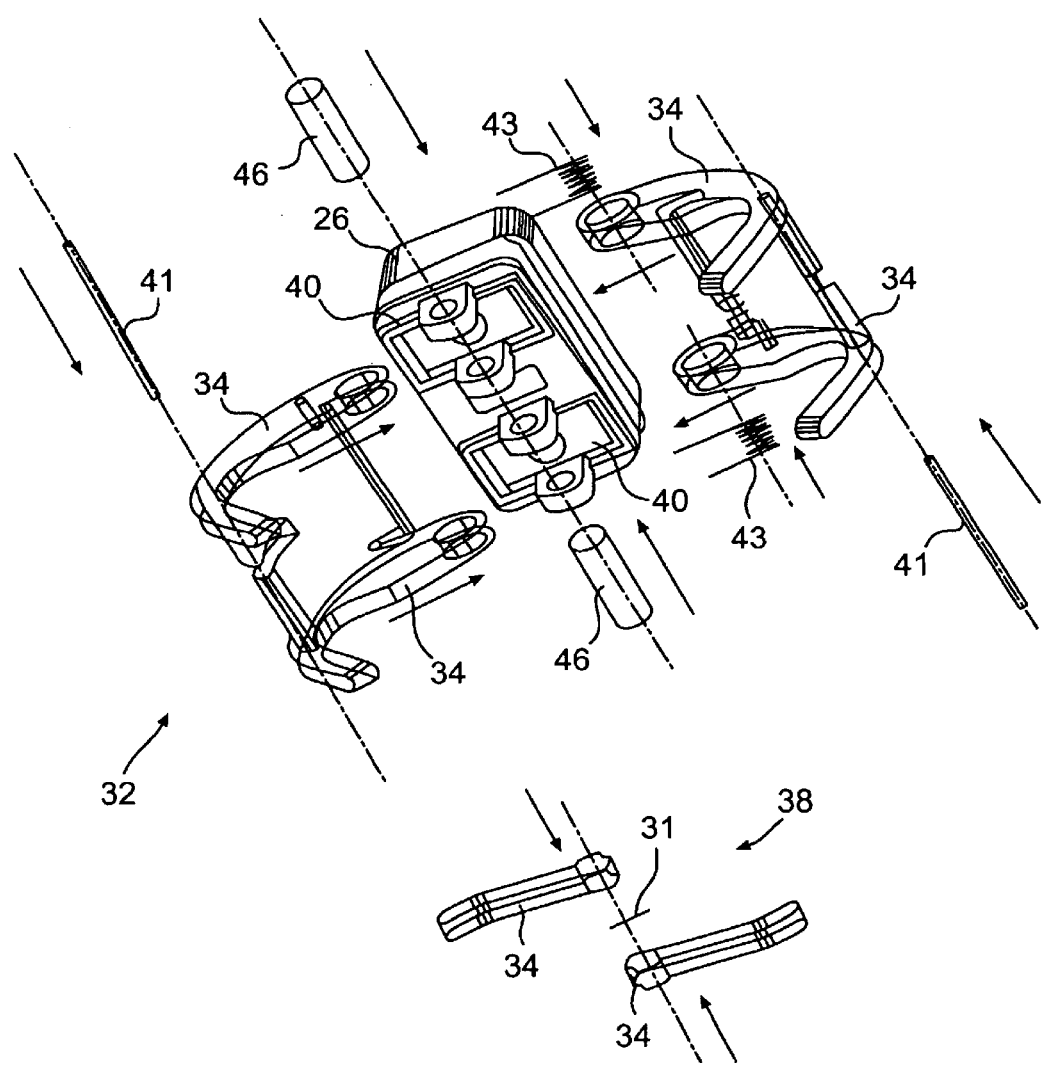
FIG. 9 is an explode view showing how a housing may connect to the second preferred clamp.

FIGS. 8A and 8B show perspective views of clamp 32 and fault indicator housing 26 enclosing electronic circuitry with 28 having a magnetic sensor (reed switch 38). Thus, housing 26 acts to hold circuitry 28 at a fixed position inside housing 26. Because reed switch 38 is at a fixed position in circuitry 28, housing 26 acts to hold reed switch 38 at a fixed position relative to housing 26.

As depicted in FIGS. 8A and 8B, recording device 30 is in the cocked, or ready to install, position.

In FIGS. 8A and 8B recording device 30 is shown in the open or cocked position. Device 30 includes fault indicator housing 26 employed with clamp 32. Clamp 32 is a spring loaded, over center, toggle clamp that allows device 30 to have a high degree of sensing, or trip accuracy over a range of electrical cable or conductor outer diameter sizes.

Figure 12C:
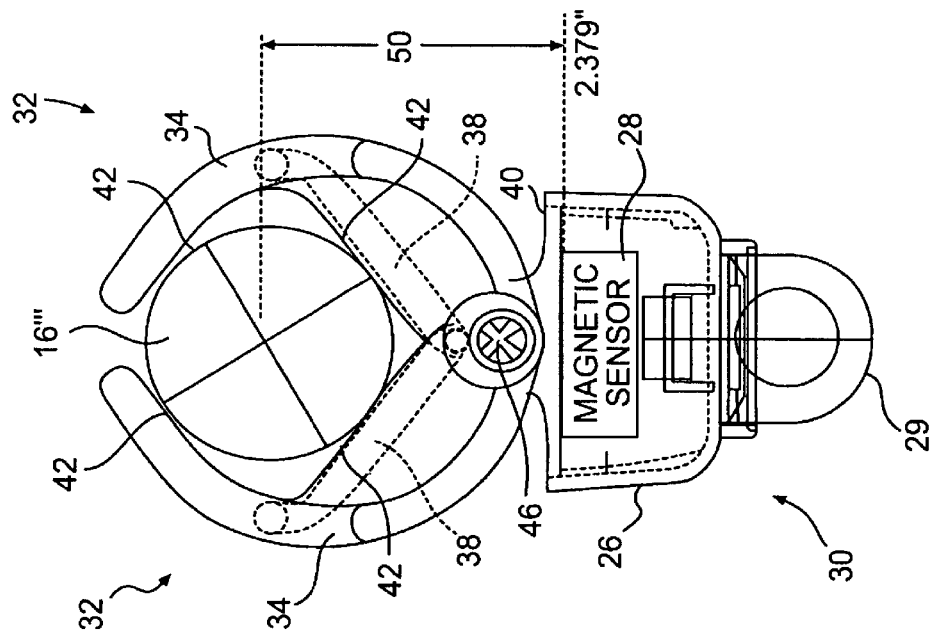

FIGS. 12A, 12B, 12C and 2D show device 30 clamped to various cable diameters and emphasize the ability of clamp 32 to maintain a conductor center at a substantially constant distance to circuit 28. In FIGS. 12A, 12B, 12C and 12D, the respective conductors are shown in cross section. In FIG. 12A, recording device 30 is shown clamping conductor 16. Conductor 16 has a diameter of 0.4". Distance 50 is depicted as the distance from the center of conductor 16 to circuit 28 and is shown to be 2.443".

In FIG. 12B, conductor 16' has a diameter of approximately 0.9" and distance 50 is measured at 2.394".

In FIG. 12C, conductor 16" has a diameter of approximately 1.25" and distance 50 is 2.396".

Figure 12D:
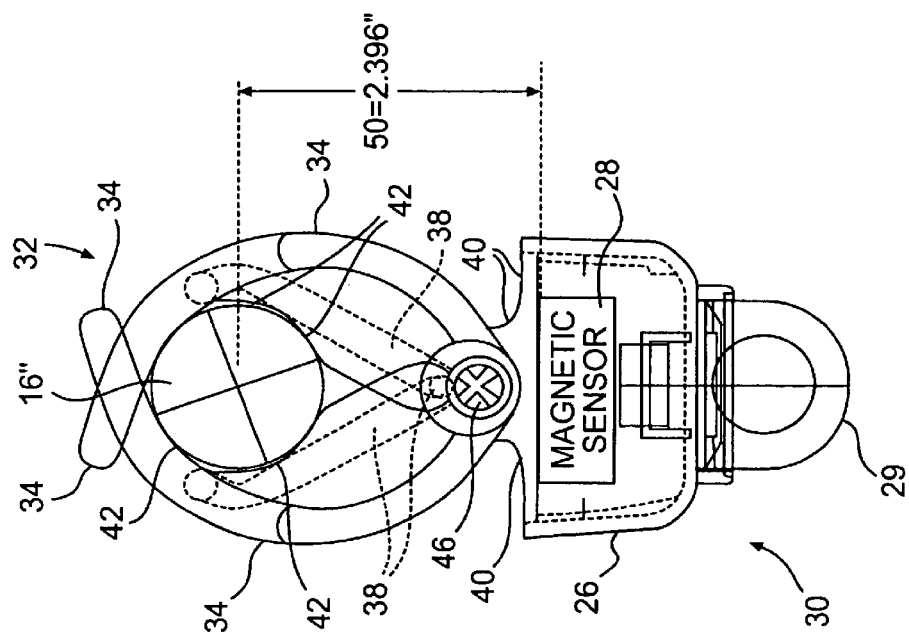

In FIG. 12D, conductor 16'" has a diameter of approximately 2.0" and distance 50 is 2.379".

FIG. 13A is a table showing cable diameter in the first column, and the corresponding distance between the center of the cable and the edge of circuit 28. In the third column is a variation, with the 1.75" cable as the nominal reference of 0.

FIG. 13B is a plot of cable diameter versus the distance between the center of the cable and the edge of circuit 28.

FIG. 13C is a plot of cable diameter versus variation of the distance between the center of the cable and the edge of circuit 28, using a reference of 2.378". Although 4 discreet cable diameters are shown in FIGS. 12A, 12B, 12C and 12D, clamp 32 when operating over a relative range of 0.4S to 2.2S, maintains the variation to be no more than 2.733% (0.065/2.378) of the nominal center distance of 2.378"S, S being a scaling factor.

Figure 11:
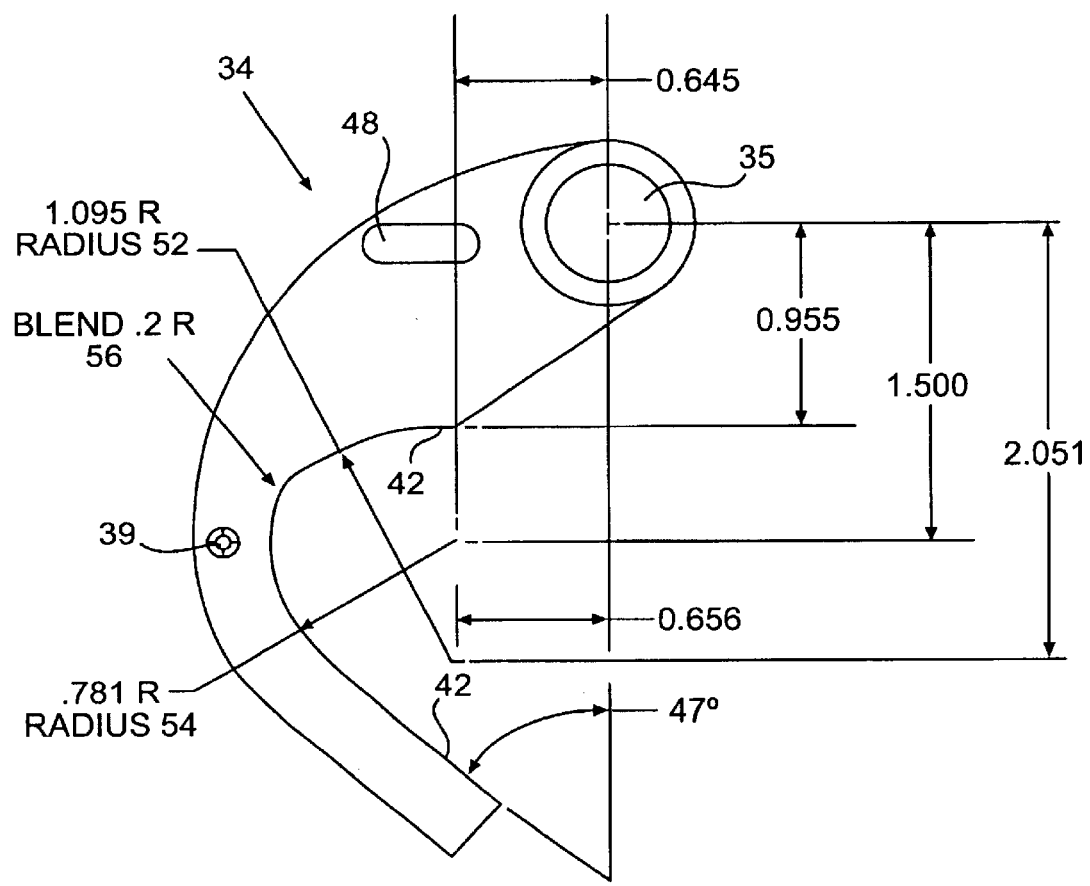
FIG. 11 is a diagram of the clamp jaw automatic locating curve.

In the specific example of FIG. 11, S is 1. Of course the second preferred clamp may be scaled up (S>1) to accommodate a larger cables, or may be scaled down (S<1) to accommodate smaller cables.

It is preferred to operate a clamp over a range, to maintain the variation to be no more than 6% of a nominal center distance.

Clamp 32 includes 4 clamp jaws 42. Each jaw 42 defines a shape that holds hold a range of cable diameters at essentially constant distance from the clamp pivot axis. FIG. 11 shows the curve is composed of two radius-curved surfaces, radii 52 extends into the straight clamp arm extension, and the inner end radii 54 provides an apex with the clamp support structure. The two radius curves are joined with a short blend radius 56 to avoid a stress riser. These three radii provide clamping of cables from 0.4-inch diameter up to 2.20-inch diameter with a maximum variation of about 1/16 inch in cable center position.

In general, suitable curves may be derived using an iterative process of adjusting a starting structure to accommodate sequentially fitted cable diameter.

In summary, jaw 42 is geometrically shaped to maintain the center of cable 16 the same distance to circuit 28 located within the indicator housing 26, even though the outer diameter of cable 16 may vary. More specifically, clamp jaw contour 42 maintains reed switch 38 (FIG. 4) in circuitry 28 a constant distance from the center of cable 16, while the outer diameter of cable 16 may vary from 0.4 inches to 2.2 inches.

Thus, the second preferred clamp helps to maintain a constant trip current calibration regardless of the outer diameter of cable 16.

Thus, the second preferred clamp allows a single device to work at a constant calibrations setting over a range of cable diameters.

Housing 26 includes polycarbonate polymer and defines a rectangular body, a display window used to view the state of the light 22 (FIG. 4). Housing 26 encloses circuit 28.

Clamp 34 acts to mechanically couple fault indicator housing 26 to power line 16. Utility personal may install recording device 30 on power lines 16 or 15 by first locking clamp 32 in the cocked position. To do so, hold clamp arms 34 with both hands while spreading clamp 34 arms out and away from each other. With either or both index fingers, lift trigger assembly 38 up and away from back cover 40 until locked. This action stores energy in clamping springs 43.

Figure 10:
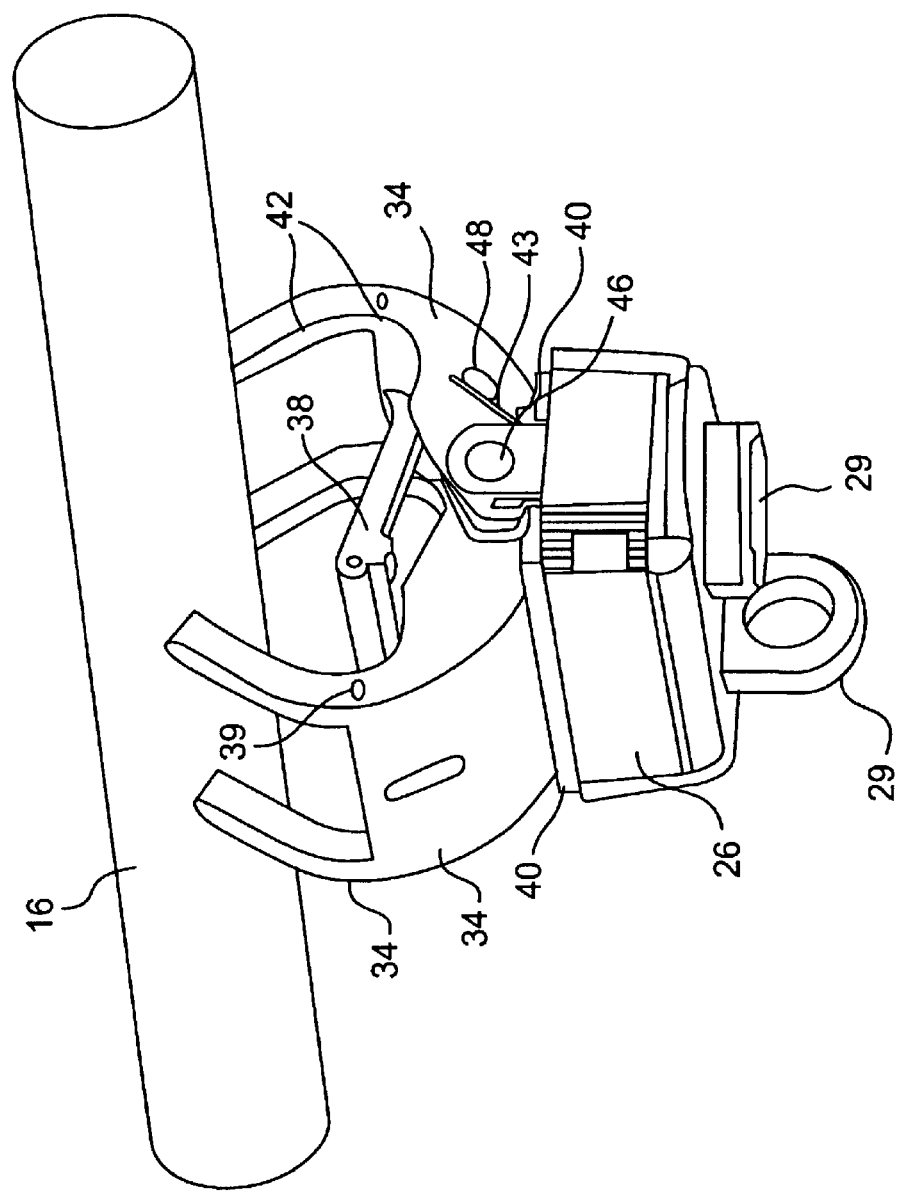
FIG. 10 is a diagram of a housing in preparation for mounting on a line.

Installation lug 29 is made to receive the hooked end of a lineman's tool (not shown) by which a lineman may align device 30 with power line 16 in accordance with FIG. 10. In FIG. 10, pushing recording device 30 upward will cause trigger assembly 38 to contact power line 16 while clamp arms 34 straddle power line 16. Continued downward pressure on trigger assembly 38 by power line 16 will cause trigger arms 36 to become disengaged from each other and cave in toward back cover 40, thereby releasing energy stored within the coiled clamping springs 43. This release of energy causes clamp arms 34 to collapse in a snap action, gripping and holding power line 16 between clamp jaw contour 42. Thus Device 30 is held securely in place, being firmly clinched by and making intimate contact with clamp jaw contour 42, and deriving clamping force from clamping springs 43.

The clamp arms are spring loaded with maximum loading when clamp arms are farthest away from each other and trigger assembly is positioned up ward, away from back cover 40. Minimum loading occurs when clamp arms are closest together and trigger assembly is collapsed and closest to the back cover. Clamping springs 43 are telescopically and concentrically situated with in hole 35 of clamp arms 34 with the spring ends held in place by the torsional force achieved by securing one spring end to a spring slot and the other spring end to post 48.

In the event of a fault current surge in a power line, such as power line 16, recording device 30 detects the faulted circuit and, in response to the detected surge, renders the appropriate faulted indication, via electromechanical flag, flashing light emitting diode, etc., (not shown) which indication may be viewed through display window 27 of the device. In this second preferred embodiment, indicator 22 is an electromechanical flag. Device 30 continues to render a faulted indication until system conditions permit device 30 to automatically reset and render a system normal indication. Thus, technician 24, who is inspecting various parts of distribution system 1, may observe the state of indicator 22 and be thus informed of the current surge that occurred on cable 16.

Reed switch 38 is oriented and located such that it will be closed by the magnetic field generated by cable 16. Optimally, switch 38 is oriented perpendicular to the magnetic field from cable 16. On the occurrence of a current surge on cable 16, magnetic reads switch 38 effectively detects the excessive current in cable 16 and switch 38 thus closes for the duration of the surge. The duration of the surge is typically in a range 0.001 to 10 seconds. Subsequently, circuitry 28 conditionally activates coil 40 to change the position of electromechanical indicator flag 22, depending on certain conditions.

In summary, line mounted faulted circuit indicators are typically mounted directly and permanently on an overhead conductor or an underground cable in a high voltage alternating current power distribution system. These devices derive their operating power from either being capacitively or inductively coupled to the line or contain an internal battery within the device. The device indicates a faulted circuit via a flashing light, mechanical flag, audible sound or radio signal. These indicators may sense faulted or overcurrent conditions in the line by means of a magnetic sensor, that is sensitive to and registers the excessive magnetic field generated by the line during a fault event. The amount of fault current needed to activate the sensor is typically a function of the distance between the sensor located within the device, and the center of the cable being monitored. Thus, parameters in conventional devices may be set depending on the cable diameter. A device set for a certain cable diameter may lose its accuracy when applied to a smaller or larger cable. For this reason, many conventional line mounted faulted circuit indicators are misapplied and subsequently fail to operate properly.

The exemplary embodiments of the present invention overcomes this drawback by providing a clamp that adjusts depending on varying cable diameters, thereby maintaining a higher degree of accuracy and ease of application.

Benefits, other advantages, and solutions to problems have been described above with regard to specific examples. The benefits, advantages, solutions to problems, and any element(s) that may cause any benefit, advantage, or solution to occur or become more pronounced are not critical, required, or essential feature or element of any of the claims.

Additional advantages and modifications will readily occur to those skilled in the art. The invention in its broader aspects is therefore not limited to the specific details, representative systems and methods, and illustrative examples shown and described. Accordingly, departures may be made from such details without departing from the spirit or the scope of Applicants' general inventive concept. The invention is defined in the following claims. In general, the words "first," "second," etc., employed in the claims do not necessarily denote an order.

What is claimed is:

1. An apparatus for use with conductors of varying radii, the apparatus comprising:
    a holder for receiving a circuit at a fixed position relative to the holder;
    a first member coupled to the holder; and
    a second member coupled to the holder,
wherein the first and second members are shaped such that, when engaged with a first conductor having a first radius, the center of the first conductor and a point in the holder define a line, and the holder is separated from the center of the first conductor by a first distance, and when engaged with a second conductor having a radius larger than the first radius, the center of the second conductor is substantially on the line, and the holder is separated from the center of the second conductor by a second distance, a difference between the first and second distances being less than a difference between the first and second radii.

2. The apparatus of claim 1 wherein the circuit defines an edge, and includes a flux detector at a fixed position relative to the edge.

3. The apparatus of claim 1 wherein there is no substantial difference between the first and second distances.

4. The apparatus of claim 1 wherein the first radius is in the range 0.2 to 1.1, the second radius is in the range 0.2 to 1.1, and there is no substantial difference between the first and second distances.

5. The apparatus of claim 1 wherein the first radius is in the range 0.2S to 1.1S, the second radius is in the range 0.2S to 1.1S, and there is no substantial difference between the first and second distances, wherein S is a scaling factor.

6. The apparatus of claim 5 wherein S is 1.

7. The apparatus of claim 1 wherein the difference between the first and second distances is no more than 6% of the first distance.

8. A method for a system including a plurality of assemblies, each assembly including a holder for receiving a circuit at a fixed position relative to the holder, the method comprising
    engaging, using a first assembly in the plurality of assemblies, a first conductor having a first radius, such that the holder is separated from a center of the first conductor by a first distance; and
    engaging, using a second assembly in the plurality of assemblies, a second conductor having a radius larger than the first radius, such that the holder is separated from the center of the second conductor by a second distance, wherein there is no substantial difference between the first and second distances.

9. The method of claim 8 wherein the circuit defines an edge, and includes a flux detector at a fixed position relative to the edge.

10. The method of claim 8 wherein the first radius is in the range 0.2 to 1.1, the second radius is in the range 0.2 to 1.1, and there is no substantial difference between the first and second distances.

11. The method of claim 8 wherein the first radius is in the range 0.2S to 1.1S, the second radius is in the range 0.2S to 1.1S, and there is no substantial difference between the first and second distances, wherein S is a scaling factor.

12. The method of claim 11 wherein S is 1.

13. The method of claim 8 wherein the difference between the first and second distances is no more than 6% of the first distance.

14. A mechanical configuration for a system including a plurality of assembies, each assembly including a holder for receiving a circuit at a fixed position relative to the holder, the configuration comprising:
    means for engaging, using a first assembly in the plurality of assemblies, a first conductor having a first radius, such that the holder is separated from a center of the first conductor by a first distance; and
    means for engaging, using a second assembly in the plurality of assemblies, a second conductor having a radius larger than the first radius, such that the holder is separated from the center of the second conductor by a second distance, a difference between the first and second distances being less than a difference between the first and second radii.

15. The configuration of claim 14 wherein the circuit defines an edge, and includes a flux detector at a fixed position relative to the edge.

16. The configuration of claim 14 wherein there is no substantial difference between the first and second distances.

17. The configuration of claim 14 wherein the first radius is in the range 0.2 to 1.1, the second radius is in the range 0.2 to 1.1, and there is no substantial difference between the first and second distances.

18. The configuration of claim 14 wherein the first radius is in the range 0.2S to 1.1S, the second radius is in the range 0.2S to 1.1S, and there is no substantial difference between the first and second distances, wherein S is a scaling factor.

19. The configuration of claim 18 wherein S is 1.

20. The configuration of claim 14 wherein the difference between the first and second distances is no more than 6% of the first distance.

21. An apparatus for use with conductors of varying radii comprising:
    a holder for receiving a circuit at a fixed position relative to the holder;
    a first member coupled to the holder; and
    a second member coupled to the holder,
wherein the first and second members are shaped such that, when engaged with a first conductor having a first radius, the holder is separated from a center of the first conductor by a first distance, and when engaged with a second conductor having a radius larger than the first radius, the holder is separated from a center of the second conductor by a second distance, wherein there is no substantial difference between the first and second distances.

22. The apparatus of claim 21 wherein the circuit includes a magnetic switch.

* * * * *